(12) United States Patent
Fazelpour

(10) Patent No.: US 6,781,229 B1
(45) Date of Patent: Aug. 24, 2004

(54) METHOD FOR INTEGRATING PASSIVES ON-DIE UTILIZING UNDER BUMP METAL AND RELATED STRUCTURE

(75) Inventor: Siamak Fazelpour, San Diego, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/025,438

(22) Filed: Dec. 19, 2001

(51) Int. Cl.[7] .................. H01L 23/12; H01L 23/48; H01L 21/4763
(52) U.S. Cl. .............. 257/700; 257/758; 257/762; 257/765; 438/614; 438/622
(58) Field of Search .................. 257/508, 531, 257/626, 700, 737, 758, 762, 765; 438/190, 361, 612–618, 622, 381

(56) References Cited

U.S. PATENT DOCUMENTS 6,077,765 A * 6/2000 Naya
6,091,310 A * 7/2000 Utsumi et al.
6,100,589 A * 8/2000 Tanaka ....................... 257/758
6,261,467 B1 * 7/2001 Giri et al.

* cited by examiner

*Primary Examiner*—Ha Tran Nguyen
(74) *Attorney, Agent, or Firm*—Farjami & Farjami LLP

(57) ABSTRACT

A passive component is realized on-die by fabricating a first conductor from either a layer of interconnect metal comprising copper or aluminum and being between approximately 1.0 micron and approximately 2.0 microns thick, or from a layer of under bump metal comprising either copper or aluminum and being between approximately 2.0 microns to approximately 5.0 microns thick. Following, a first isolation layer is formed over the first conductor. A second conductor having at least one external pad and comprising under bump metal is next fabricated over the first isolation layer. The second conductor can be fabricated substantially directly above the first conductor, for example. Thereafter, a second isolation layer having a hole over the external pad of the second conductor is formed over the second conductor. Subsequently, a bump attach site is fabricated at the hole in the second isolation layer over the external pad of the second conductor.

30 Claims, 4 Drawing Sheets

METHOD FOR INTEGRATING PASSIVES ON-DIE UTILIZING UNDER BUMP METAL AND RELATED STRUCTURE

BACKGROUND OF THE INVENTION

1. Field of the Invention

The present invention is generally in the field of semiconductor fabrication and packaging. More specifically, the present invention is in the field of integrating passives on-die.

2. Related Art

Conventional means for realizing passive components such as inductors and transformers include both on-die and off-die approaches. Conventional on-die approaches typically involve utilizing interconnect metal and dielectric formed during various die fabrication steps to form the passive component. A transformer can be fabricated on-die, for example, by patterning interconnect metal deposited on a layer of dielectric to form a pair of cross-coupled inductors.

By way of background, the coupling between the two inductors is called mutual inductance. The quality factor ("Q") of an inductor is determined by the formula $Q=2\pi fL/R$, where L is the inductance of the inductor, f is the operating frequency of the inductor and R is the resistance of the inductor. A relatively low quality factor signifies a relatively high energy loss. Therefore, by increasing the quality factors of a transformner's cross-coupled inductors, the energy loss in the transformer can be reduced. Also, increasing the inductance, or decreasing the resistivity of the inductors will decrease the transformer's energy loss.

However, attempts in the art to realize on-die passives, such as an on-die transformer, encounter various problems such as unwanted capacitance, low self-resonance frequency and low coefficient of coupling of the transformer's cross-coupled inductors. These problems become even more severe as the operating frequency of the transformer increases. For example, these problems greatly hinder the design of transformers for use in RF applications in the commercially important wireless communication range of 800 to 2400 MHz. Additionally, because on-die interconnect metal is in most cases less than 1.0 micron thick, the thickness of the inductors is limited, resulting in undesirably high resistivity and, consequently, a low quality factor. Furthermore, on-die transformers take up already limited die space that can be used for other circuits, devices, or components.

As stated above, passives such as transformers can also be realized off-die, for example as a discrete component on the substrate or printed circuit board. However, an off-die transformer suffers from various disadvantages. The off-die transformer requires relatively long off-die wires and interconnect lines to connect the transformer terminals to on-die devices. The relatively long off-die wires and interconnect lines result in added and unwanted resistance, capacitance and inductance, which translate to energy loss. Additionally, interconnects for an off-die transformer are subject to long-term damage from vibration, corrosion, chemical contamination, oxidation and other chemical and physical forces, resulting in reduced long-term reliability. Furthermore, placing a transformer off-die requires assembly of at least two components, i.e. the semiconductor die itself and the off-die transformer. The required assembly of two or more components introduces corresponding reliability issues and also results in greater manufacturing cost.

There is thus a need in the art for an approach for realizing passives such as inductors and transformers having high quality factor, low resistivity and high inductance. There is also a need in the art for realizing passives such as inductors and transformers without consuming additional semiconductor die space.

SUMMARY OF THE INVENTION

The present invention is directed to method for integrating passives on-die utilizing under bump metal and related structure. According to one embodiment, a first conductor if fabricated. The first conductor can be fabricated, for example, from a layer of interconnect metal comprising either copper or aluminum and being between approximately 1.0 micron to approximately 2.0 microns thick. In one embodiment, the first conductor is fabricated from a layer of under bump metal comprising either copper or aluminum and being between approximately 2.0 microns to approximately 5.0 microns thick. Following, a first isolation layer is formed over the first conductor.

A second conductor having at least one external pad and comprising under bump metal is next fabricated over the first isolation layer. The second conductor can be fabricated substantially directly above the first conductor, for example, resulting in cross-coupling of the first and second conductors so as to form a transformer. In one embodiment, the first isolation layer can comprise at least one via. Thereafter, a second isolation layer having a hole over the external pad of the second conductor is formed over the second conductor. The first and second isolation layers can comprise, for example, either BCB or polyimide and can be between approximately 5.0 microns to approximately 10.0 microns thick. Subsequently, a bump attach site is fabricated at the hole in the second isolation layer over the external pad of the second conductor.

In one embodiment, the invention is a structure fabricated according to the process steps discussed above. As such, the structure comprises a first conductor over which is situated a first isolation layer. A second conductor comprising under bump metal and having at least one external pad is situated over the first isolation layer. In one embodiment, the first isolation layer comprises at least one via through which the second conductor is connected to the first conductor. Additionally, a second isolation layer having at least one hole over the external pad of the second conductor is situated over the second conductor. Furthermore, the structure comprises a bump attach site situated at the hole in the second isolation layer over the external pad of the second conductor.

DETAILED DESCRIPTION OF THE INVENTION

The present invention is directed to method for integrating passives on-die utilizing under bump metal and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed merely to exemplary embodiments of the invention. To maintain brevity, other embodiments utilizing the principles of the present invention are not specifically described in the present application and are not specifically illustrated by the present drawings.

Figure 1:
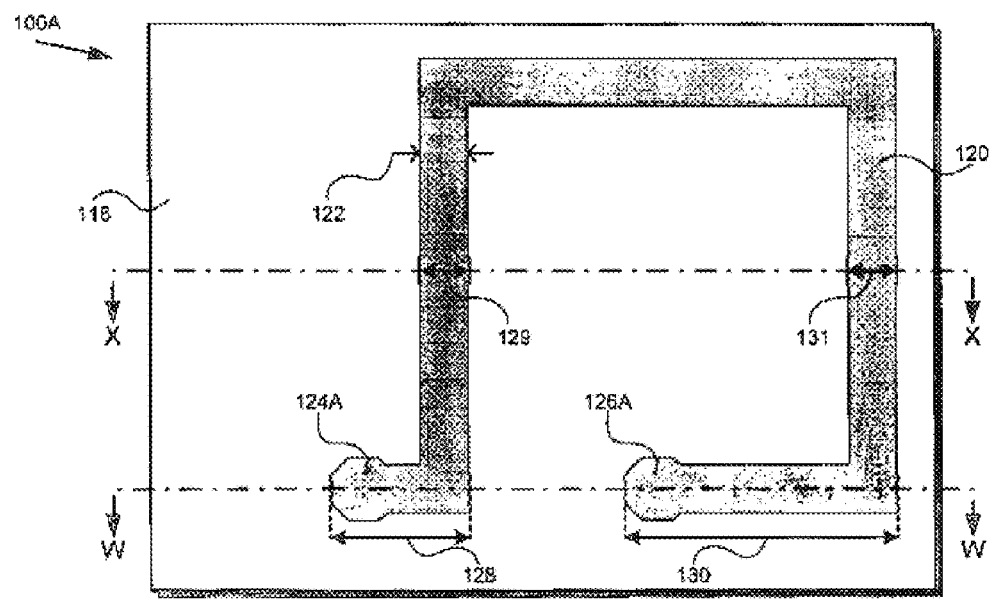
FIG. 1 illustrates an inductor fabricated according to an embodiment of the present invention.
Figure 1:
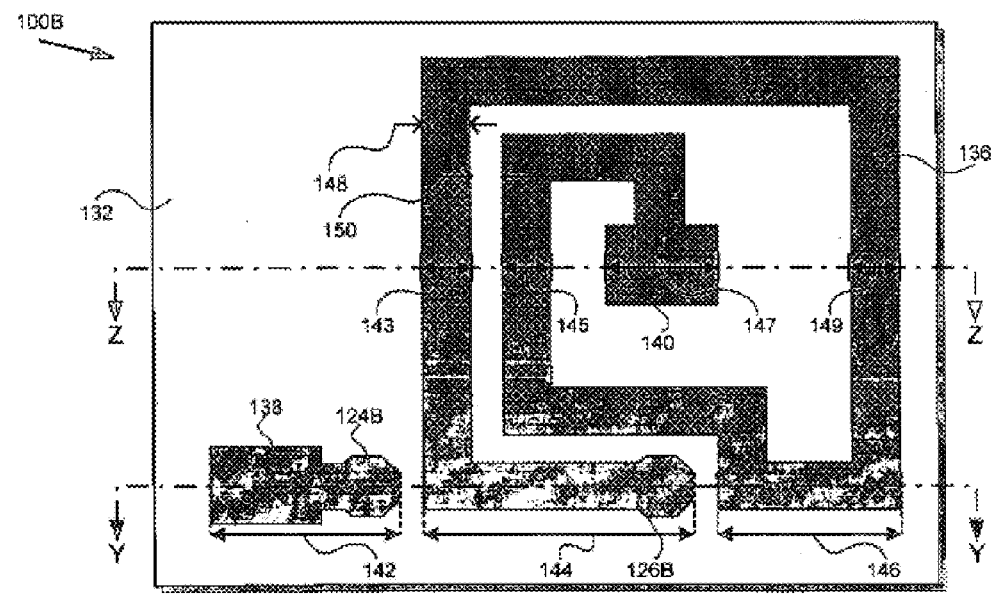

Illustrated in FIG. 1 are exemplary structures 100A and 100B, which are utilized to describe one embodiment of the present invention. Certain details and features have been left out of FIG. 1 which are apparent to a person of ordinary skill in the art. In FIG. 1, structure 100A shows a top view of a region of a semiconductor die whereon a layer of metal has been deposited on the top surface of substrate 118 and patterned to form first conductor 120. In the present embodiment, first conductor 120 is patterned from the last interconnect metal layer on the semiconductor die in a manner known in the art and can comprise, for example, copper, aluminum or other suitable interconnect metal. The width, i.e. line width 122, of first conductor 120 can be between approximately 20.0 microns and approximately 40.0 microns, and the thickness of first conductor 120 can be between approximately 1.0 micron to 2.0 microns in the present embodiment.

As shown, first conductor 120 has via site 124A and via site 126A, which serve as access points to first conductor 120 when the invention's subsequent layers of material are deposited over the semiconductor die and over its last interconnect metal layer, i.e. over first conductor 120. Thus, via sites 124A and 126A can function, for example, as die bond pads. In one embodiment, bond pads comprising, for example, aluminum, can be fabricated on via sites 124A and 126A, and a thin passivation layer of dielectric can be deposited over substrate 118 and first conductor 120, except over the bond pads. It is noted that the bond pads and thin passivation layer are not shown in any of the Figures. Substrate 118 can be, for example, a layer of a dielectric such as silicon oxide formed on the semiconductor die.

Continuing with structure 100A in FIG. 1, conductor segment 128 and conductor segment 130 indicate where line W—W intersects first conductor 120. In a similar fashion, conductor segment 129 and conductor segment 131 indicate where line X—X intersects first conductor 120. Reference is now made to structure 100B in FIG. 1, which shows a top view of the same region of the semiconductor die shown in structure 100A, but at a subsequent processing step. More specifically, structure 100B shows structure 100A after steps of depositing or forming an isolation layer, i.e. isolation layer 132, over substrate 118 and first conductor 120, opening vias in isolation layer 132 to expose first conductor 120 at via sites 124A and 126A and depositing and patterning an under bump metal ("UBM") layer over isolation layer 132 and in the vias opened over via sites 124A and 126A. In the present embodiment, the UBM layer is patterned to form second conductor 136 shown in structure 100B. Isolation layer 132 is thus situated between first conductor 120 and second conductor 136. In the present embodiment, isolation layer 132 can comprise, for example, Benzocyclobutene ("BCB") or polyimide with a thickness of between approximately 5.0 microns and approximately 10.0 microns.

Continuing with structure 100B, the width of second conductor 136, indicated by line width 148, is between approximately 20.0 microns to approximately 40.0 microns, and the line spacing of second conductor 136, indicated by line spacing 150, can be approximately 20.0 microns. Second conductor 136 can comprise, for example, copper, aluminum or other suitable metal known and have a thickness of between approximately 2.0 microns and approximately 5.0 microns. Second conductor 136, as stated above, is patterned from a layer of under bump metal deposited over isolation layer 132, including at via sites 124B and 126B of second conductor 136, and in the vias opened in isolation layer 132 over via sites 124A and 126A where first conductor 120 is exposed. In this manner, second conductor 136 is connected, or coupled, to first conductor 120 through the vias opened in isolation layer 132.

More specifically, a first connection between second conductor 136 and first conductor 120 is made at via site 124B through the via opened in isolation layer 132 over via site 124A, and a second connection is made at via site 126B through the via opened in isolation layer 132 over via site 126A. By virtue of these two connections, an inductor is formed comprising both first conductor 120 and second conductor 136 and having windings on both first conductor 120 and second conductor 136. It is noted that the vias opened in isolation layer 132 are not shown in FIG. 1.

Continuing with structure 100B, second conductor 136 further comprises external pad 138 and external pad 140. External pads 138 and 140 function as the terminals of the inductor formed by connecting first conductor 120 to second conductor 136 in the manner described above. Also shown in structure 100B are conductor segments 142, 144 and 146, which indicate where second conductor 136 is intersected by line Y—Y, and conductor segments 143, 145, 147 and 149, which indicate where second conductor 136 is intersected by line Z—Z.

Thus, structures 100A and 100B in FIG. 1 illustrate connecting a first conductor segment patterned from a last interconnect metal layer on-die and a second conductor patterned from an under bump metal layer to form an inductor having windings on both the last interconnect metal layer and the under bump metal layer, in accordance with one embodiment.

Figure 2:
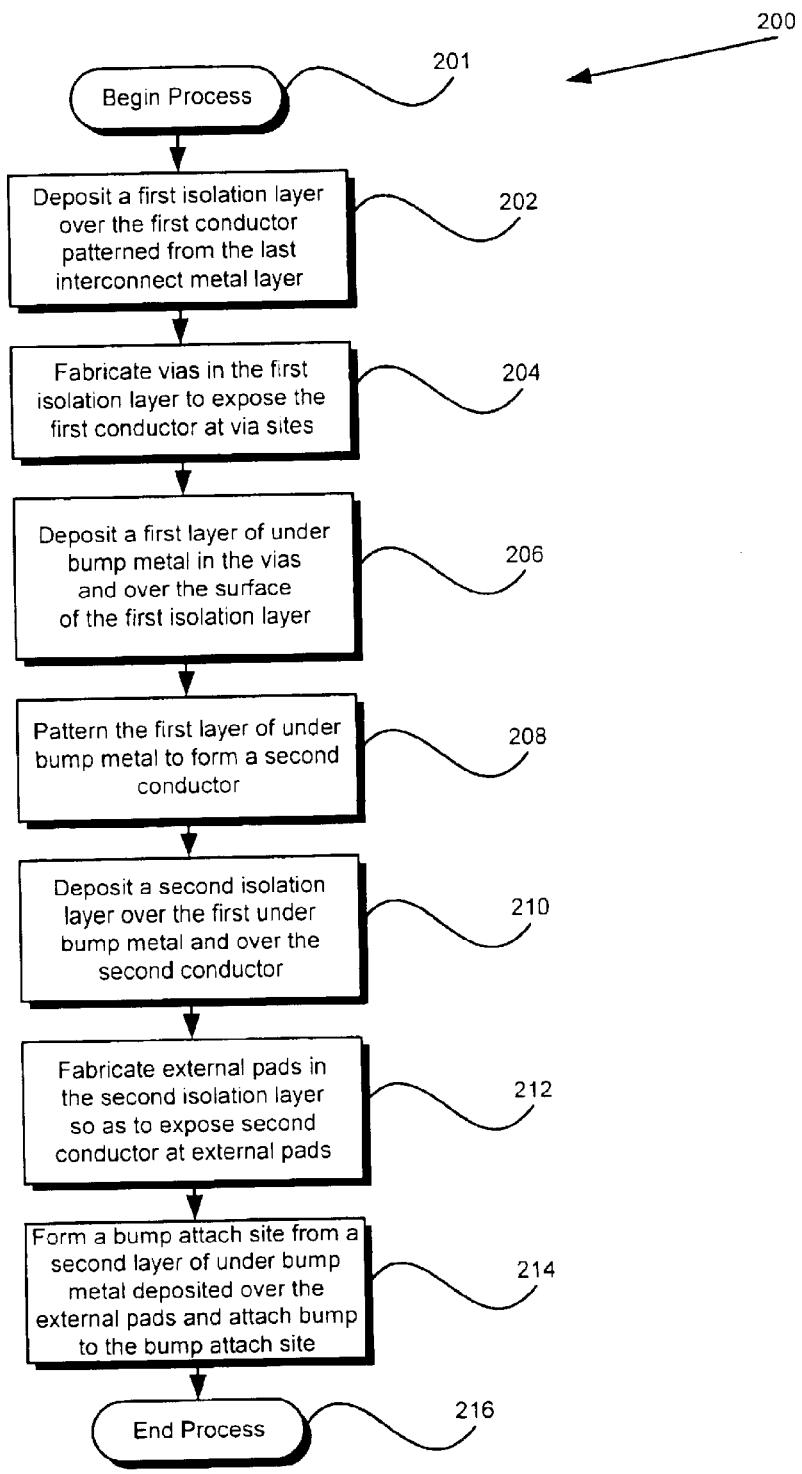
FIG. 2 is a flowchart illustrating the steps taken to implement an embodiment of the invention.

Referring now to FIG. 2, flowchart 200 describes the steps in processing a semiconductor die which includes structure 100A of FIG. 1, according to one embodiment. Certain details have been left out of flowchart 200 which are apparent to a person of ordinary skill in the art. For example, a step in flowchart 200 may consist of one or more substeps or may involve specialized equipment, as known in the art. Further, it is noted that other embodiments may use steps different from those shown in flowchart 200. Also, certain steps have been left out in order to not obscure the invention.

Figure 3A:
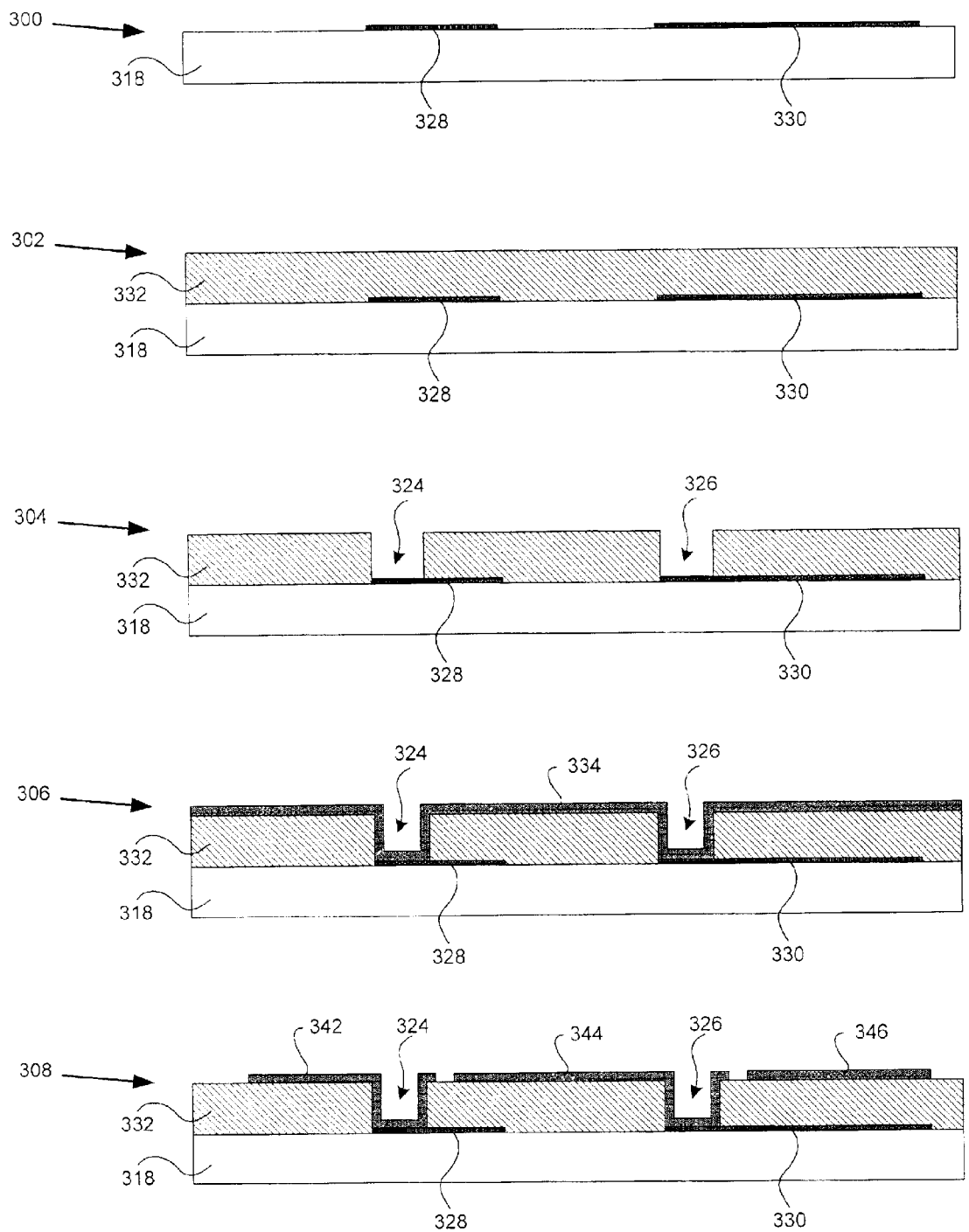
FIG. 3A illustrates cross-sectional views, which include portions of a semiconductor die processed according to an embodiment of the invention, corresponding to certain steps of FIG. 2.
Figure 3B:
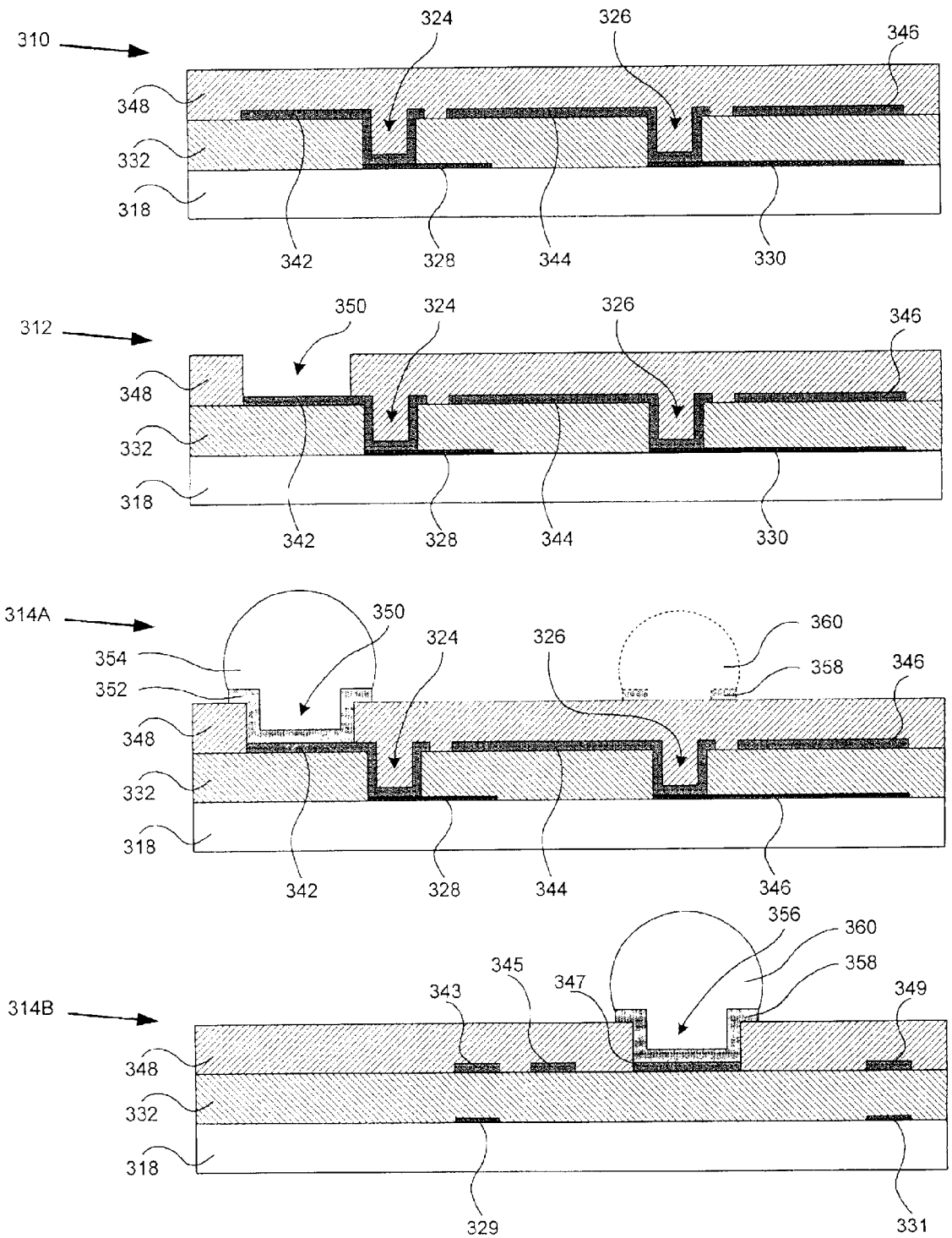
FIG. 3B illustrates cross-sectional views, which include portions of a semiconductor die processed according to an embodiment of the invention, corresponding to certain steps of FIG. 2.

The result of performing each step in flowchart 200 is illustrated with the aid of FIGS. 3A and 3B. Referring briefly to FIG. 3A, structure 300 of FIG. 3A shows a cross-sectional view of structure 100A in FIG. 1 along line W. In particular, structure 300 shows a cross-section of a portion of a semiconductor die at step 201, i.e. the starting point, of flowchart 200. Substrate 118 is shown in structure 300 as substrate 318, and conductor segments 128 and 130 of structure 100A are shown respectively as conductor segments 328 and 330. It is appreciated that conductor segments 328 and 330 are the only parts of a conductor structure, i.e. first conductor 120 of structure 100A visible in the cross-sectional view. Structure 300 thus shows a cross-sectional view of a region of a semiconductor die, including conductor segments 328 and 330 of a first conductor, on which further processing in accordance with the present embodiment is performed.

Now referring to briefly to FIG. 3B as well as to FIG. 3A, each of structures 302, 304, 306, 308, 310, 312 and 314 (i.e. structures 314A and 314B) of FIGS. 3A and 3B illustrates the result of performing on structure 300, steps 202, 204, 206, 208, 210, 212 and 214, respectively, of flowchart 200 of FIG. 2. For example, structure 302 shows structure 300 after the processing of step 202; structure 304 shows structure 302 after the processing of step 204; and so forth.

Referring now to FIGS. 2 and 3A, step 202 of flowchart 200 comprises depositing an isolation layer over substrate 318 and conductor segments 328 and 330 of the first conductor. First isolation layer 332 can comprise, for example, BCB with a thickness of between approximately 5.0 microns to 10.0 microns. Other suitable isolation materials besides BCB can be used in step 202 of flowchart 200 such as, for example, polyimide. Methods for depositing first isolation layer 332 are known in the art. Referring to FIG. 3A, the result of step 202 of flowchart 200 is illustrated by structure 302. Thus, structure 302 of FIG. 3A shows structure 300 after first isolation layer 332 has been deposited over substrate 318 and conductor segments 328 and 330 of the first conductor.

Continuing with FIGS. 2 and 3A, step 204 of flowchart 200 comprises opening vias, i.e. via 324 and via 326, in first isolation layer 332 utilizing photolithography techniques known in the art. For example, vias 324 and 326 can be fabricated by depositing photoresist over first isolation layer 332, patterning the photoresist, etching the vias and stripping the photoresist. As shown, vias 324 and 326 fabricated in first isolation layer 332 expose conductor segments 328 and 330, respectively, and it is appreciated that the parts of conductor segments 328 and 330 exposed by vias 324 and 326 correspond to via sites 124A and 126A, respectively, of first conductor 120 of structure 100A in FIG. 1. Structure 304 of FIG. 3A thus shows structure 302, including first isolation layer 332 and conductor segments 328 and 330, after the fabrication of vias 324 and 326 in first isolation layer 332.

Continuing with FIGS. 2 and 3A, step 206 of flowchart 200 comprises depositing, or "plating," under bump metal layer 334 over the top surface of first isolation layer 332 and in vias 324 and 326. Techniques for depositing under bump metal are known in the art and include, for example, vapor deposition, sputtering, and electrolytic or electroless plating. Under bump metal layer 334 can comprise, for example, copper, aluminum or other suitable metal. As shown, physical connections are made between under bump metal layer 334 and conductor segments 328 and 330 by way of vias 324 and 326, respectively. Thus, structure 306 of FIG. 3A shows structure 304 following the deposition of under bump metal layer 334 over the top surface of first isolation layer 332 and in vias 324 and 336.

Continuing with FIGS. 2 and 3A, step 208 of flowchart 200 comprises patterning under bump metal layer 334 to form a conductor segment on the top surface of first isolation layer 332. As such, structure 308 depicts a cross-sectional view of structure 100B in FIG. 1 where line Y—Y intersects structure 100B, and it is appreciated that the resulting conductor patterned from under bump metal layer 334 corresponds to second conductor 136 of structure 100B. Conductor segments 342, 344 and 346 in structure 308 in FIG. 3A therefore correspond respectively to conductor segments 142, 144 and 146 in structure 100B in FIG. 1. Patterning of under bump metal layer 334 can be done in a manner known in the art, for example, by a wet etch technique. Referring to FIG. 3A, structure 308 of FIG. 3A thus shows structure 306, including first isolation layer 332 and conductor segments 328 and 330, after patterning of under bump metal layer 334 to form a conductor on the top surface of first isolation layer 332.

Referring now to FIGS. 2 and 3B, step 310 of flowchart 200 comprises depositing second isolation layer 348 over first isolation layer 332, over conductor segments 342, 344 and 346, i.e. over the second conductor patterned from under bump metal layer 334, and in holes 324 and 326. Second isolation layer 348 comprises a suitable dielectric material known in the art, such as BCB or polyimide, and can be between approximately 5.0 microns and 10.0 microns thick. Structure 310 thus shows structure 308 following the deposition of second isolation layer 348 over first isolation layer 332 and conductor segments 342, 344 and 346 and in holes 324 and 326.

Continuing with FIGS. 2 and 313, step 212 of flowchart 200 comprises fabricating holes, e.g. hole 350, in second isolation layer 348 in order to expose those sections of the second conductor patterned from under bump metal layer 334 where connections to the external world can be made. In other words, such holes formed in second isolation layer 348 at step 212 expose the second conductor so as to form external pads. As shown in structure 312, hole 350 exposes a section of conductor segment 342, and it is noted that the part of conductor segment 342 exposed by hole 350 corresponds to external pad 138 of second conductor 136 in structure 100B in FIG. 1. It is appreciated that additional holes can be opened in other regions of second isolation layer 348 as may be desired in order to provide additional access points to the second conductor, but that such additional holes are not observable in the cross-sectional view illustrated by structure 312. For example, in the present embodiment, a second hole is opened in second isolation layer 348 to form a second external pad corresponding to external pad 140 of second conductor 136 in FIG. 1B. Thus, structure 310 in FIG. 3B shows structure 308 after the creation hole 350 in second isolation layer 348 in order to expose the second conductor.

Continuing with FIG. 2 and referring to structure 314A of FIG. 3B, step 214 of flowchart 200 comprises depositing a second layer of under bump metal over the top surface of second isolation layer 348 and in hole 350, patterning the second layer of under bump metal utilizing photolithography processes to form bump attach site 352 and depositing and reflowing solder material at bump attach site 352 to form bump 354. The second layer of under bump metal can consist, for example, of a stack of different metals such as copper, nickel and gold, deposited in a manner known in the art. Bump 354 can comprise solder or other suitable bumping materials.

As discussed above in reference to structure 312 of FIG. 3B, more than one hole can be opened in second isolation layer 348 in order to provide additional access to the second conductor. In particular, although not observable in the cross-sectional view shown in structure 312, a second hole has been opened to form a second external pad to the second conductor. Thus, and referring again to structure 314A, it is appreciated that the processes utilized to form bump attachment site 352 and to form bump 354 at hole 350 can also be utilized to form a second bump attach site, i.e. bump attach site 358, and the creation of a second bump, i.e. bump 360, at the second hole. It is noted that in structure 314A, bump attach site 358 and bump 360 are indicated by dashed lines to indicate the fact that bump attach site 358 and bump 360 are not on the same cross-sectional plane as the other features of structure 314A.

Continuing with step 214 of flowchart 200 and referring now to structure 314B in FIG. 3B, a cross-sectional view is shown of the same semiconductor region at the same processing step illustrated by structure 314A, but at a different plane of intersection. More particularly, structure 314B is a cross-sectional view of the combination of structures 100A and 100B of FIG. 1 along lines X—X and Z—Z, respectively, following the steps of depositing a second isolation layer, i.e. second isolation layer 348, over first isolation layer 132 and second conductor 136, opening a hole, i.e. hole 354, in the second isolation layer to expose second conductor 136 at via site 140, forming a bump attachment site, i.e. bump attach site 358, in the hole at via site 140 and depositing a bump, i.e. bump 360, on the bump attach site. Thus, in structure 314B, first isolation layer 318 of structure 314B corresponds to first isolation layer 118 of structure 100A, conductor segments 329 and 331 correspond to conductor segments 129 and 131 of structure 100A, respectively, and conductor segments 343, 345, 347 and 349 of structure 314B correspond to conductor segments 143, 145, 147 and 149 of structure 100B, respectively. Flowchart 200 then ends at step 216.

The present embodiment as indicated by flowchart 200 and as illustrated by FIGS. 1, 3A and 3B results in an exemplary inductor made of discrete conductor segments connected to each other by vias. The conductors, i.e. first conductor 120 and second conductor 136, are fabricated separately on different layers of materials. For example, first conductor 120 can be patterned from the last interconnect metal on-die, while second conductor 136 can be patterned from the first layer of under bump metal deposited over the die. Vias can be fabricated in the isolation layer separating the last interconnect metal layer and the first under bump metal layer in order for physical contact to be made between the two layers. Thus, the inductor formed from this process comprises windings on both the last interconnect metal layer and the layer of under bump metal.

The inductor realized in the manner described above has lower parasitic capacitance than similar components realized off-die, for example as discrete components. The low capacitance is achieved, in part, by the enhanced control over feature sizes such as line width and spacing attributable to the photolithography processes utilized. Moreover, due to the fact that the invention's inductor is not a discrete component, the parasitic capacitance attributable to the routing lines connecting a discrete component to the die are virtually eliminated. As a result, the present inductor exhibits a lower parasitic capacitance than off-die inductors. Further, since the present inductor is fabricated on the semiconductor die, it is smaller than typical off-die inductors.

The inductor realized by the present invention also has advantages over on-die inductors realized by conventional approaches. One advantage, for example, is the significantly lower resistivity due to the greater thickness of the present inductor over typical inductors fabricated inside the semiconductor die. For example, by patterning a first conductor from a last interconnect metal having a thickness of 2.0 microns and combining it with a second conductor patterned from a layer of under bump metal having a thickness of 5.0 microns, the present inductor's thickness can be approximately 7.0 microns. This thickness is substantially greater than the thickness of on-die inductors, which is typically in the range of only 1.5 to 3.0 microns. As is known in the art, the resistance of an inductor is inversely proportional to its thickness. Therefore, for the same length and width, the present inductor has a lower resistance than typical on-die inductors. Further, since the quality factor "Q" of an inductor is inversely proportional to its resistance, the present inductor manifestly has a superior quality factor. Another advantage of the present inductor over typical on-die inductors is that the invention's inductor does not compete for space on the semiconductor die with other components. Therefore, the present inductor can cover as much of the area on the top surface of the semiconductor die as required in a specific application.

Thus, the embodiment of the invention indicated by flowchart 200 and illustrated by FIGS. 1, 3A and 3B results in an inductor realized on top of the semiconductor die, the inductor having a first conductor patterned from an interconnect metal layer and a second conductor patterned from a layer of under bump metal, the first and second conductors being connected to one another through vias, and thus forming a single inductor.

In one embodiment of the present invention not illustrated in any of the Figures, a first conductor is patterned from an interconnect metal layer on-die, which can comprise, for example, copper, aluminum or other suitable interconnect metals known in the art. The first conductor can be between approximately 1.0 micron and approximately 2.0 microns thick. After the first conductor is patterned, a first isolation layer comprising a dielectric material such as BCB or polyimide is deposited over the die and the first conductor. The first isolation layer can be, for example, between 5.0 microns and 10.0 microns thick. Next, a layer of under bump metal comprising copper, aluminum or other suitable metal and being between approximately 2.0 microns and 5.0 microns thick is deposited over the first isolation layer. Utilizing photolithography techniques known in the art, the layer of under bump metal is patterned to form a second conductor substantially directly above the first inductor. The second conductor has terminals function as its external pads. Following, a second isolation layer comprising, for example, BCB or polyimide and being between approximately 5.0 microns and 10.0 microns thick, is deposited over the first isolation layer and over the second conductor and its external pads. Holes are then opened in the second isolation layer to expose the external pads of the second conductor. A second layer of UBM is then deposited over the second isolation layer and in the holes exposing the external pads of the second conductor. The second layer of UBM can comprise a stack of metals consisting of, for example, copper, nickel and gold. Bump attach sites are then formed over the external pads of the second conductor, and bump material, for example solder, is deposited in the bump attach sites to form bumps.

This embodiment results in a transformer comprising cross-coupled inductors, i.e. the first and second conductors, realized on different layers and functioning as the transformer's coils. The transformer has various advantageous qualities, including high coupling between the inductors. Also, because the cross-coupled inductors are realized on different layers, they are electromagnetically coupled to one another to a large degree, and substantially all the magnetic field from one coil of the transformer goes through the other coil, resulting in high efficiency.

From the above description of the invention it is manifest that various techniques can be used for implementing the concepts of the present invention without departing from its scope. Also, it is appreciated that certain details have been left out in order to not obscure the invention but that these details are known to those skilled in the art. Moreover, while the invention has been described with specific reference to certain embodiments, a person of ordinary skills in the art would appreciate that changes can be made in form and detail without departing from the spirit and the scope of the invention. For example, while embodiments described above incorporated only the first under bump metal layer into the passive component, it appreciated that additional layers of UBM can be incorporated as desired to produce, for example, a longer or thicker inductor. As another example, whereas the embodiments described involved connecting interconnect metal to under bump metal as a means for realizing passive components on the die surface, it is appreciated that passive components can be realized on the die surface utilizing only under bump metal. As a further example, instead of an inductor or transformer, the present invention is readily applicable to many different types of passives including, for instance, capacitors.

The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for integrating passives on-die utilizing under bump metal and related structure have been described.

What is claimed is:

1. A structure comprising:

a first conductor situated in a semiconductor die, said first conductor comprising interconnect metal;

a first isolation layer situated over said first conductor;

a second conductor comprising at least two conductor segments situated over said first isolation layer, said second conductor comprising under bump metal, said second conductor having at least one external pad associated with one of said at least two conductor segments, wherein said first conductor electrically connects said at least two conductor segments:

a second isolation layer situated over said second conductor, said second isolation layer having at least one hole over said at least one external pad of said second conductor;

a bump attach site located at said at least one hole over said at least one external pad.

2. The structure of claim 1 wherein said under bump metal comprises material selected from the group consisting of copper and aluminum.

3. The structure of claim 1 wherein said first conductor is between approximately 2.0 microns and 5.0 microns thick.

4. The structure of claim 1 wherein said first isolation layer comprises at least one via.

5. The structure of claim 4 wherein said first conductor is connected to said second conductor through said at least one via so as to form an inductor.

6. The structure of claim 1 wherein said interconnect metal comprises material selected from the group consisting of copper and aluminum.

7. The structure of claim 6 wherein said first conductor is between approximately 1.0 micron and approximately 2.0 microns thick.

8. The structure of claim 1 wherein said second conductor is patterned from a layer of under bump metal.

9. The structure of claim 8 wherein said layer of under bump material comprises material selected from the group consisting of copper and aluminum.

10. The structure of claim 9 wherein said second conductor is between approximately 2.0 microns and approximately 5.0 microns thick.

11. The structure of claim 10 wherein said first and said second isolation layers comprise a dielectric.

12. The structure of claim 11 wherein said dielectric comprises a material selected from the group consisting of BCB and polyimide.

13. The structure of claim 11 wherein each of said first and said second isolation layers is between approximately 5.0 microns and approximately 10.0 microns thick.

14. The structure of claim 1 wherein said second conductor is situated substantially directly above said first conductor.

15. The structure of claim 14 wherein said first and said second conductors are cross-coupled so as to form a transformer.

16. A method for realizing passives, said method comprising steps of:

fabricating a first conductor in a semiconductor die, said first conductor comprising interconnect metal;

forming a first isolation layer over said first conductor;

fabricating a second conductor comprising at least two conductor segments over said first isolation layer, said second conductor comprising under bump metal, said second conductor having at least one external pad associated with one of said at least two conductor segments, wherein said first conductor electrically connects said at least two conductor segments;

forming a second isolation layer over said second conductor, said second isolation layer having at least one hole over said at least one external pad of said second conductor:

fabricating a bump attach site at said at least one hole over said at least one external pad.

17. The method of claim 16 wherein said under bump metal comprises material selected from the group consisting of copper and aluminum.

18. The method of claim 16 wherein said first conductor is between approximately 2.0 microns and 5.0 microns thick.

19. The method of claim 16 further comprising a step of fabricating at least one via in said first isolation layer prior to said step of depositing said second isolation layer.

20. The method of claim 19 further comprising a step of connecting said first conductor to said second conductor through said at least one via so as to form an inductor.

21. The method of claim 16 wherein said interconnect metal comprises material selected from the group consisting of copper and aluminum.

22. The method of claim 21 wherein said first conductor is between approximately 1.0 micron and approximately 2.0 microns thick.

23. The method of claim 16 wherein said second conductor is patterned from a layer of under bump metal.

24. The method of claim 23 wherein said layer of under bump metal comprises material selected from the group consisting of copper and aluminum.

25. The method of claim 24 wherein said second conductor is between approximately 2.0 microns and approximately 5.0 microns thick.

26. The method of claim 25 wherein said first and said second isolation layers comprise a dielectric.

27. The method of claim 26 wherein said dielectric comprises a material selected from the group consisting of BCB and polyimide.

28. The method of claim 16 wherein each of said first and said second isolation layers is between approximately 5.0 microns and approximately 10.0 microns thick.

29. The method of claim 16 wherein said second conductor is fabricated substantially directly above said first conductor.

30. The structure of claim 29 wherein said first and said second conductors are cross-coupled so as to form a transformer.

* * * * *